United States Patent
Song

(10) Patent No.: US 8,487,341 B2
(45) Date of Patent: Jul. 16, 2013

(54) SEMICONDUCTOR DEVICE HAVING A PLURALITY OF BONDING LAYERS

(75) Inventor: June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 228 days.

(21) Appl. No.: 12/933,599

(22) PCT Filed: Mar. 19, 2009

(86) PCT No.: PCT/KR2009/001424
§ 371 (c)(1),
(2), (4) Date: Dec. 27, 2010

(87) PCT Pub. No.: WO2009/116830
PCT Pub. Date: Sep. 24, 2009

(65) Prior Publication Data
US 2011/0101413 A1    May 5, 2011

(30) Foreign Application Priority Data
Mar. 19, 2008    (KR) .................. 10-2008-0025222

(51) Int. Cl.
H01L 33/00    (2010.01)
(52) U.S. Cl.
USPC .................... 257/103; 257/E33.013; 438/458

(58) Field of Classification Search
USPC ............ 257/103, E33.013, E21.211; 438/458
See application file for complete search history.

(56) References Cited

U.S. PATENT DOCUMENTS

| 7,442,569 | B2 | 10/2008 | Lee et al. | |
|---|---|---|---|---|
| 2004/0245543 | A1 | 12/2004 | Yoo | |
| 2011/0168971 | A1* | 7/2011 | Song | 257/13 |
| 2011/0215364 | A1* | 9/2011 | Sugawara et al. | 257/99 |
| 2011/0220928 | A1* | 9/2011 | Muramoto | 257/94 |

FOREIGN PATENT DOCUMENTS

| KR | 10-2007-0011916 A | 1/2007 |
|---|---|---|
| KR | 10-0723249 B1 | 5/2007 |

* cited by examiner

*Primary Examiner* — Phuc Dang
(74) *Attorney, Agent, or Firm* — Birch, Stewart, Kolasch & Birch, LLP

(57) ABSTRACT

Provided is a method of manufacturing a semiconductor device. In the method, a growth substrate provided with a single crystal semiconductor thin layer, a support substrate, and a temporary substrate are prepared, the growth substrate, the support substrate, and the temporary substrate are bonded to one another with the support substrate therebetween through functional wafer coupling layers, the growth substrate is lifted off from the single crystal semiconductor thin layer, and the temporary substrate is lifted off from the support substrate.

18 Claims, 5 Drawing Sheets

SEMICONDUCTOR DEVICE HAVING A PLURALITY OF BONDING LAYERS

TECHNICAL FIELD

The present disclosure relates to a semiconductor device and a method of manufacturing the semiconductor device.

BACKGROUND ART

Group III-V single crystal semiconductor thin layers including nitride, and group II-VI single crystal semiconductor thin layers including oxide are grown on the upper portion of a transparent growth substrate at a temperature of about 400° C. or more and in atmosphere of various types of severe gas.

In general, a growth substrate is formed of sapphire ($Al_2O_3$), silicon carbide (SiC), gallium nitride (GaN), aluminum nitride (AlN), aluminum gallium nitride (AlGaN), zinc oxide (ZnO), or silicon (Si).

Especially, sapphire is economically and technically advantageous, and thus, it is widely used. However, since the electrical and thermal conductivities of a growth substrate formed of sapphire are even poorer than that of a growth substrate formed of other materials such as Si, it is difficult to manufacture high performance electronic devices or photoelectric devices on the growth substrate formed of sapphire.

For example, when a single crystal thin layer formed of gallium nitride (GaN), which is a group III-V semiconductor, is grown on a growth substrate formed of sapphire to manufacture a light emitting diode (LED) that is a photoelectric device, it is difficult to dispose two electrodes for applying an external current to the LED in a vertical structure facing the upper and lower sides of the single crystal thin layer, due to the sapphire growth substrate that is electrically insulated.

Thus, to apply the external current to the two electrodes of the LED, MESA etching is performed such that the gallium nitride layer adjacent to the sapphire growth substrate is exposed to air, and electrodes are separately disposed in a horizontal structure on the upper portion of the gallium nitride single crystal thin layer, which have different charge carriers.

However, the LED having a horizontal structure generates a large amount of heat due to current crowding that an applied external current is collected on an edge that is MESA-etched. In addition, due to lower thermal conductivity of the sapphire growth substrate, it is difficult to emit the large amount of heat generated when the device is driven, to the outside. Especially, this difficulty negatively affects the service life and reliability of a device driven when applying a large current.

To address the current crowding and inefficient heat emission, a vertical device manufacturing method has been suggested in which a support having excellent electrical and thermal conductivities is formed on the upper portion of the single crystal semiconductor thin layer at the opposite side to the sapphire growth substrate, and a photon-beam having a band of a specific wavelength is irradiated on the rear surface of the sapphire growth substrate, so that the single crystal semiconductor thin layer is lifted off from the sapphire growth substrate and transferred.

The effect of the vertical device manufacturing method through the lifting-off and transferring of the single crystal semiconductor thin layer depends on how effectively the support having excellent electrical and thermal conductivities is formed.

Methods of forming a closely adhered support include an electro-plating process and a wafer bonding process, which are applied to partially form a vertical device.

When the electro-plating process is applied to form a closely adhered support, it is relatively easy to form a vertical device, but a final product has poor reliability.

Meanwhile, as illustrated in FIGS. 1A to 1E, when a support formed through a wafer bonding process is used, a process is relatively simple, and a final product has excellent reliability.

FIGS. 1A to 1E are cross-sectional views illustrating wafer bonding between dissimilar materials and a single crystal semiconductor thin layer transfer process in the related art.

Referring to FIG. 1A, first, a single crystal multi-layer thin layer 102 for an electronic or photoelectric device including a gallium nitride (GaN)-based semiconductor is grown on a transparent sapphire growth substrate 101 at a temperature of 500° C. or more in atmosphere of various types of severe gas, and then, a soldering material 103 for wafer bonding is continuously formed on the single crystal multi-layer thin layer 102. The soldering material 103 may be alloy or solid solution containing metal having a melting point less than 300° C. such as indium (I), stannum (Sn), or zinc (Zn).

Then, referring to FIG. 1B, the same material as the soldering material 103 formed on the single crystal multi-layer thin layer 102 or a soldering material 202 including a metal forming soldering alloy and used for wafer bonding is formed on a support 201 having excellent electrical and thermal conductivities. For example, the support 201 may be formed of Si, Ge, or GaAs, and the soldering materials 103 and 202 may be formed of Au—Sn, Au—In, or Pd—In.

Referring to FIG. 1C, after operation S10 in which the two wafers are prepared as described above, the wafers are bonded by bring the soldering materials 103 and 202 to contact with each other at a temperature less than 300° C. and a predetermined pressure.

After operation S20 in which the two wafers are bonded as described above, a photon-beam having a band of a specific wavelength is irradiated on the rear surface of the sapphire growth substrate 101, so that the single crystal semiconductor thin layer 102 is lifted off from the sapphire growth substrate (refer to FIG. 1D) and transferred to the upper side of the support 201 in operation S30 (refer to FIG. 1E).

After that, although not shown, high performance electronic or photoelectric devices having various dimensions and shapes are formed.

However, the above-described wafer bonding process requires wafer bonding between materials having different thermal expansion coefficient, which is not easy. Especially, due to thermal shock generated after wafer bonding between different materials, a growth substrate, a single crystal semiconductor thin layer, and a support may have defects such as a crack, a breakage, and debonding.

In addition, a limitation that a wafer bonding temperature less than 300° C. is required to minimize thermal stress generated after wafer bonding, and limitations caused by a soldering material should be solved. Furthermore, a wafer bonding process adapted for mass production is required.

Thus, to solve the above-described limitations and reduce manufacturing costs of electronic or photoelectric devices through mass production, a method of transferring a single crystal semiconductor thin layer to the upper side of a dissimilar support substrate should be developed, and simultaneously, a method of manufacturing high performance electronic or photoelectric devices using this method should be developed.

DISCLOSURE

Technical Problem

Embodiments provide a semiconductor device and a method of manufacturing the semiconductor device.

Embodiments provide a semiconductor device and a method of manufacturing the semiconductor device, which include a method of transferring a single crystal semiconductor thin layer to a dissimilar support substrate to manufacture an electronic device and a photoelectric device, and include a transferred stacked structure.

Technical Solution

In one embodiment, a method of manufacturing a semiconductor device, comprises: preparing a growth substrate provided with a single crystal semiconductor thin layer, a support substrate, and a temporary substrate; bonding the growth substrate, the support substrate and the temporary substrate to one another with the support substrate therebetween through functional wafer coupling layers; lifting off the growth substrate from the single crystal semiconductor thin layer; and lifting off the temporary substrate from the support substrate.

In another embodiment, a semiconductor device comprises: a support substrate; a functional wafer bonding layer on the support substrate; and a single crystal semiconductor thin layer on the functional wafer bonding layer.

The details of one or more embodiments are set forth in the accompanying drawings and the description below. Other features will be apparent from the description and drawings, and from the claims.

Advantageous Effects

Embodiments provide a semiconductor device and a method of manufacturing the semiconductor device.

Embodiments provide a semiconductor device and a method of manufacturing the semiconductor device, which include a method of transferring a single crystal semiconductor thin layer to a dissimilar support substrate to manufacture an electronic device and a photoelectric

MODE FOR INVENTION

Figure 1:
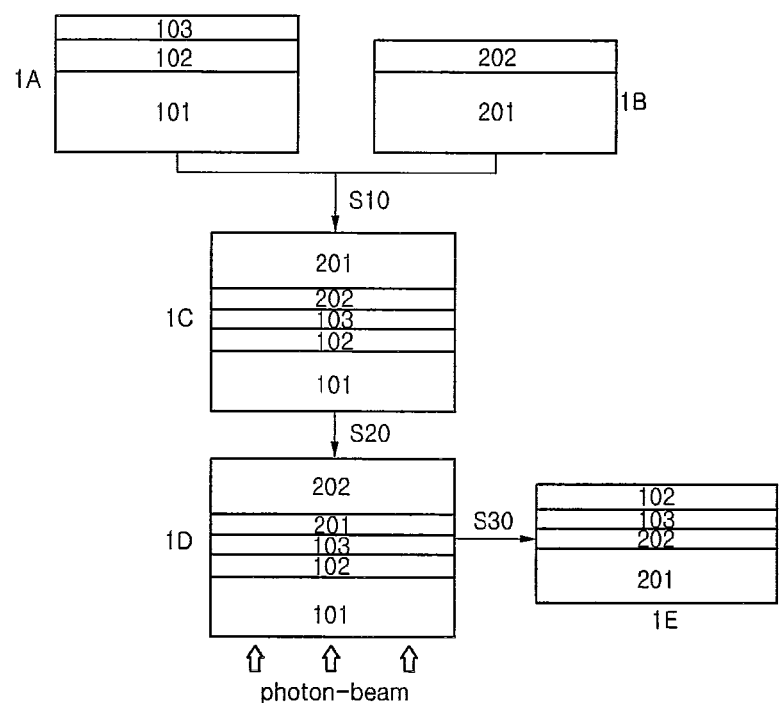
FIGS. 1A to 1E are cross-sectional views illustrating wafer bonding between dissimilar materials and a single crystal semiconductor thin layer transfer process in the related art.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a semiconductor device and a method of manufacturing the same according to embodiments will be described with reference to the accompanying drawings.

FIGS. 2A, 2B, 2C, 2D, 3A, 3B, and 3C are cross-sectional views illustrating a method of transferring a single crystal semiconductor thin layer to a support substrate in a semiconductor device and a method of manufacturing the same according to an embodiment.

Figure 2:
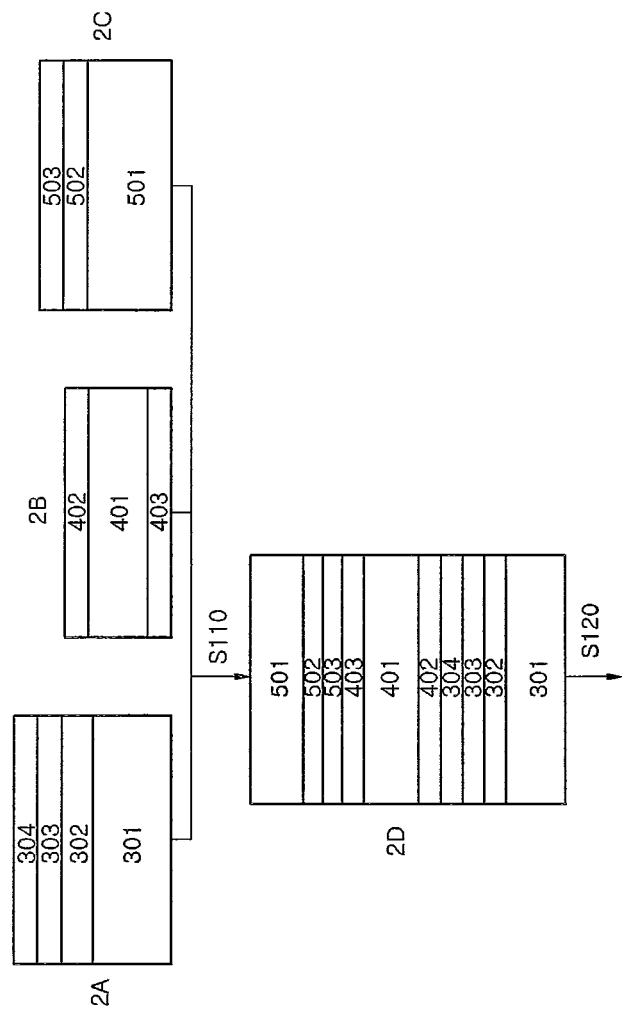
FIGS. 2A, 2B, 2C, 2D, 3A, 3B, and 3C are cross-sectional views illustrating a method of transferring a single crystal semiconductor thin layer to a support substrate in a semiconductor device and a method of manufacturing the same according to an embodiment.
Figure 3:
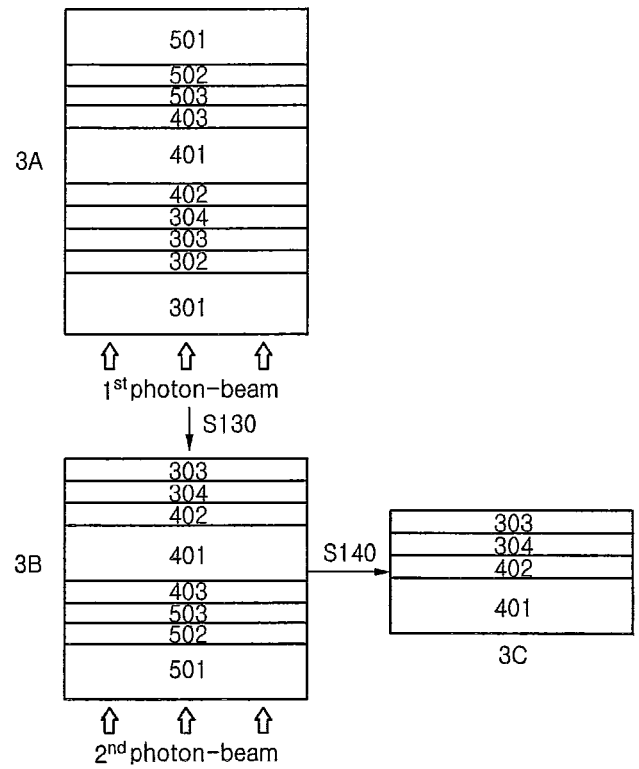

Referring to FIGS. 2 and 3, a growth substrate 301, a support substrate 401, and a temporary substrate 501 are prepared separately.

The growth substrate 301 and the temporary substrate 501 may optically have a transparency of 70% or more within a wavelength range of about 500 nm or less. For example, the growth substrate 301 and the temporary substrate 501 may be formed of one of sapphire ($Al_2O_3$), silicon carbide (SiC), gallium nitride (GaN), indium gallium nitride (InGaN), aluminum gallium nitride (AlGaN), aluminum nitride (AlN), spinel, lithium niobate, neodymium gallate, and gallium oxide ($Ga_2O_3$).

When the growth substrate 301 and the temporary substrate 501 may optically have a transparency of about 70% or more within a wavelength range of about 500 nm or less, a thermochemical decomposition reaction by irradiation of a photon-beam may be facilitated, which will be described later.

A difference in thermal expansion coefficient between the growth substrate 301 and the temporary substrate 501 may be about 2 ppm or less.

The support substrate 401 may have excellent electrical and thermal conductivities. For example, the support substrate 401 may be a wafer formed of one of Si, GaAs, Ge, SiGe, AlN, GaN, AlGaN, SiC, and AlSiC, or a plate formed of one of Ni, Cu, Nb, Mo, Ta, NbCu, MoCu, TaCu, SiAl, CuW, NiW, and NiCu.

In the current embodiment, the growth substrate 301, the support substrate 401, and the temporary substrate 501 are formed of sapphire ($Al_2O_3$), silicon (Si), and sapphire ($Al_2O_3$), respectively. The support substrate 401 is dissimilar to the growth substrate 301. Sapphire forming the growth substrate 301 may have a single crystal structure (epitaxy structure), but the support substrate 401 and the temporary substrate 501 may not have a single crystal structure.

Referring to FIG. 2A, a sacrifice layer 302 and a single crystal semiconductor thin layer 303 are sequentially formed on the front side of the growth substrate 301, and then, a functional wafer bonding layer 304 is stacked on the upper portion of the single crystal semiconductor thin layer 303.

Referring to FIG. 2B, functional wafer bonding layers 402 and 403 are stacked on the front and back sides of the support substrate 401.

Referring to FIG. 2C, a sacrifice layer 502 and a functional wafer bonding layer 503 are stacked on the front side of the temporary substrate 501.

The sacrifice layers 302 and 502 disposed on the upper portions of the growth substrate 301 and the temporary substrate 501 may be formed of a material having an energy band-gap about 6.5 eV or less. For example, the sacrifice layers 302 and 502 may include at least one of GaN, InGaN, AlGaN, AlInN, AlGaInN, InN, AlN, SiC, SiCN, ZnInN, InZnO, GaZnO, ZnO, MgZnO, PZT, ITO, $SiO_2$, and $SiN_x$.

Alternatively, the sacrifice layers 302 and 502 disposed on the upper portions of the growth substrate 301 and the temporary substrate 501 may be formed of different materials. For example, the sacrifice layer 302 disposed on the upper portion of the growth substrate 301 may be formed of InGaN, and the sacrifice layer 502 disposed on the upper portion of the temporary substrate 501 may be formed of ZnO.

Like the growth substrate 301 and the temporary substrate 501, the sacrifice layers 302 and 502 may optically have a transparency of 70% or more.

The single crystal semiconductor thin layer 303 may be a single layer or a multi layer. For example, the single crystal semiconductor thin layer 303 may include one of a group III-V compound, a group II-VI compound, Si, SiC, and SiGe. In the current embodiment, the single crystal semiconductor thin layer 303 includes an n type clad layer, an active layer, and a p type clad layer in a light emitting diode structure, which includes a group III-V nitride-based semiconductor The n type clad layer may be formed of a group III-V nitride-based semiconductor having a composition formula of $Al_xIn_yGa_{(1-x-y)}N$ ($0 \leq x \leq 1$, $0 \leq y \leq 1$, $0 \leq x+y \leq 1$), and an n type dopant is added to the n type clad layer. For example, the n type clad layer may be formed of GaN. Before the n type clad layer is grown, a material layer (referred to as a buffer layer), which buffers stress due to lattice mismatch and a thermal expansion coefficient difference, may be inserted. For example, GaN, AlN, InGaN, AlGaN, SiC, SiCN, and Re—Si (rhenium silicide) may be used.

The active layer has a quantum well structure, and is formed of a group III-V nitride-based semiconductor having a composition formula of $Al_xIn_yGa_{(1-x-y)}N$ ($0 \leq x \leq 1$, $0 \leq y \leq 1$, $0 \leq x+y \leq 1$).

Like the n type clad layer, the p type clad layer may be formed of a group III-V nitride-based semiconductor having a composition formula of $Al_xIn_yGa_{(1-x-y)}N$ ($0 \leq x \leq 1$, $0 \leq y \leq 1$, $0 \leq x+y \leq 1$), for example, be formed of GaN, and an p type dopant is added to the p type clad layer.

The functional wafer bonding layers 304, 402, 403, 503 formed respectively on the growth substrate 301, the support substrate 401, and the temporary substrate 501 may have single layers or multi layers. The functional wafer bonding layers 304, 402, 403, 503 mechanically bond the growth substrate 301, the support substrate 401, and the temporary substrate 501, and may separately or simultaneously function as an ohmic or schottky electrode that is an electrically excellent conductor, an optically excellent reflector, a diffusion barrier preventing a flow between materials, and adhesive increasing adhesion force between wafers.

The functional wafer bonding layers 304, 402, 403, and 503 disposed respectively on the growth substrate 301, the support substrate 401, and the temporary substrate 501 are formed through typical electro plating and physical/chemical deposition, and have a thickness ranging from about 1 μm to about 30 μm. For example, the functional wafer bonding layers 304, 402, 403, and 503 may be formed of Au.

In the current embodiment, the functional wafer bonding layers 304, 402, 403, and 503 are disposed on the growth substrate 301, the support substrate 401, and the temporary substrate 501, but functional wafer bonding layers may be formed on one of surfaces of the growth substrate 301 and the support substrate 401 facing each other and on one of surfaces of the support substrate 401 and the temporary substrate 501 facing each other.

As described above, after the structures illustrated in FIGS. 2A, 2B and 2C are prepared in operation S110, the functional wafer bonding layer 402 on the front side of the support substrate 401 and the functional wafer bonding layer 304 on the growth substrate 301 are brought to contact with each other and aligned, and the functional wafer bonding layer 403 on the back side of the support substrate 401 and the functional wafer bonding layer 503 on the temporary substrate 501 are brought to contact with each other and aligned, and then, the wafers are bonded in a sandwich structure to form a combined body as illustrated in FIG. 2D. At this point, a thermo-compressive bonding in which a predetermined pressure is applied at a temperature ranging from about 200° C. to about 600° C. may be used to bond the wafers.

Before forming the combined body having a sandwich structure, the sacrifice layer 302, the single crystal semiconductor thin layer 303, and the functional wafer bonding layer 304 disposed on the growth substrate 301 may be formed in a unit cell shape having a plurality of lattice cell shapes through isolation etching. Also, the sacrifice layer 502 and the functional wafer bonding layer 503 disposed on the temporary substrate 501 may be formed in a unit cell shape having a plurality of lattice cell shapes through isolation etching.

After the combined body is formed in operation S120, a first photon-beam is irradiated on the rear surface of the growth substrate 301 of the combined body having a sandwich structure to lift-off the growth substrate 301 through a thermo-chemical decomposition reaction as illustrated in FIG. 3A. For example, KrF excimer laser or YAG laser may be used as the first photon-beam.

After the growth substrate 301 is lifted-off in operation S130, a second photon-beam is irradiated on the back side of the temporary substrate 501 of the combined body having a sandwich structure to lift-off the temporary substrate 501 through a thermo-chemical decomposition reaction as illustrated in FIG. 3B. For example, KrF excimer laser or YAG laser may be used as the second photon-beam.

After the temporary substrate 501 is lifted-off in operation S140, remainders of the sacrifice layers 302 and 502 and the functional wafer bonding layers 503 and 403 are removed using dry etching or wet etching. However, it may be unnecessary to remove the functional wafer bonding layer 503 and 403.

Thus, the single crystal semiconductor thin layer 303 is transferred to the support substrate 401 as illustrated in FIG. 3C.

In the method of manufacturing the semiconductor device according to the current embodiment, the growth substrate 301 and the temporary substrate 501 are symmetrically disposed in a sandwich shape with the support substrate 401 therebetween to transfer the single crystal semiconductor thin layer 303 to the support substrate 401.

If the single crystal semiconductor thin layer 303 on the growth substrate 301 is transferred to the support substrate 401 without using the temporary substrate 501, the single crystal semiconductor thin layer 303 may be cracked or bent due to a difference in thermal expansion coefficient between the growth substrate 301 and the support substrate 401.

However, in the method of manufacturing the semiconductor device according to the current embodiment, since the growth substrate 301 and the temporary substrate 501 having similar thermal expansion coefficients are symmetrically disposed with the support substrate 401 therebetween, crack or bending of the single crystal semiconductor thin layer 303 due to a difference in thermal expansion coefficient can be prevented.

Figure 4:
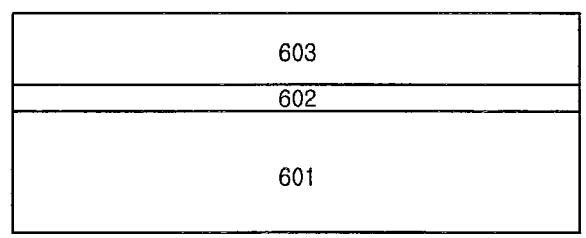
FIG. 4 is a cross-sectional view illustrating a stacked structure with a single crystal semiconductor thin layer transferred to a support substrate, according to an embodiment.

FIG. 4 is a cross-sectional view illustrating a stacked structure with a single crystal semiconductor thin layer transferred to a support substrate, according to an embodiment.

Referring to FIG. 4, a stacked structure including a support substrate 601, a functional wafer bonding layer 602 on the support substrate 601, and a single crystal semiconductor thin layer 603 on the functional wafer bonding layer 602 is manufactured according to the process illustrated in FIGS. 2 and 3.

The material of the support substrate 601 is determined according to application purposes. For example, a material that is electrically conductive and has thermally excellent conductivity may be applied to a typical vertical device. For example, the support substrate 601 may be formed of silicon (Si).

The functional wafer bonding layer 602 may be a single layer or a multi layer. In this case, the functional wafer bonding layer 602 mechanically bonds the support substrate 601 to the single crystal semiconductor thin layer 603, and may separately or simultaneously function as an ohmic or schottky electrode that is an electrically excellent conductor, an optically excellent reflector, a diffusion barrier preventing a flow between materials, and adhesive increasing adhesion force between the support substrate 601 and the single crystal semiconductor thin layer 603.

The functional wafer bonding layer 602 is formed using typical physical/chemical deposition and electro plating, and may have a thickness ranging from about 1 μm to about 30 μm. For example, the functional wafer bonding layer 602 may be formed of one of metal, alloy, and metal solid solution.

The single crystal semiconductor thin layer 603 may be a single layer or a multi layer. The single crystal semiconductor thin layer 603 may include a group III-V compound, a group II-VI compound, Si, SiC, or SiGe. For example, the single crystal semiconductor thin layer 603 includes an n type clad layer, an active layer, and a p type clad layer in a light emitting diode structure, which includes a group III-V nitride-based semiconductor.

FIGS. 5 to 9 are cross-sectional views illustrating a process of forming a vertical light emitting diode using the stacked structure of FIG. 4.

Figure 5:
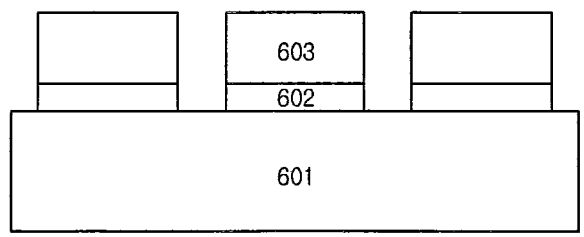
FIGS. 5 to 9 are cross-sectional views illustrating a process of forming a vertical light emitting diode using the stacked structure of FIG. 4.

Referring to FIG. 5, the single crystal semiconductor thin layer 603 is formed in a unit cell shape having a plurality of lattice cell shapes through isolation etching. At this point, the functional wafer bonding layer 602 may also be formed in a unit cell shape having a plurality of lattice cell shapes, like the single crystal semiconductor thin layer 603.

However, as illustrated in FIG. 2, isolation etching may be performed on the single crystal semiconductor thin layer 603 before forming the stacked structure of FIG. 4.

Figure 6:
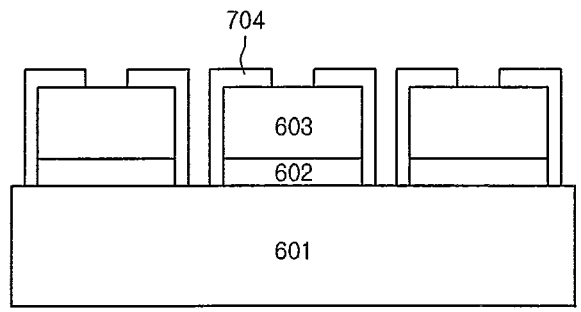

Referring to FIG. 6, a device passivation layer 704, which is formed of electrically insulated material to protect a unit device, is formed, and the device passivation layer 704 is selectively removed to expose a portion of the single crystal semiconductor thin layer 603. For example, the device passivation layer 704 may be formed of $SiO_2$.

Figure 7:
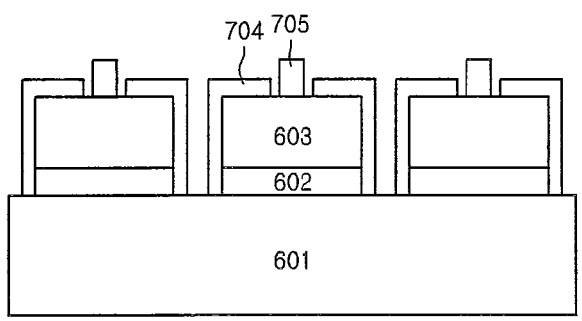

Referring to FIG. 7, ohmic electrodes 705 are formed on the single crystal semiconductor thin layer 603.

Figure 8:
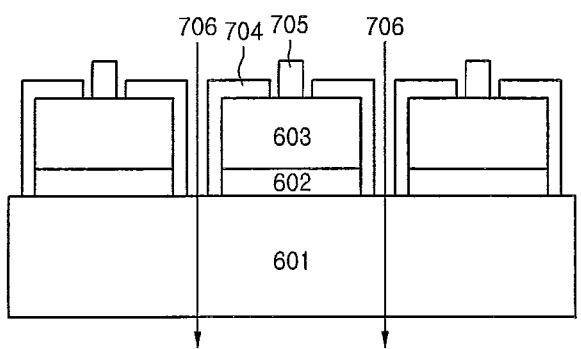
Figure 9:
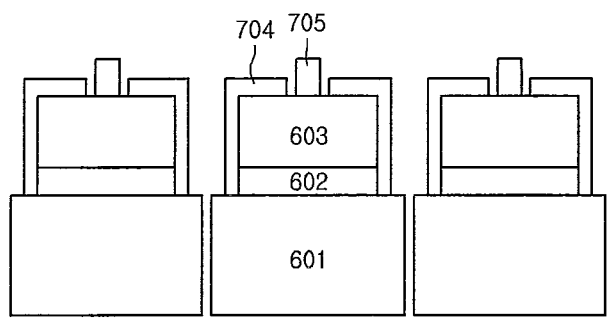

Referring to FIGS. 8 and 9, the support substrate 601 is vertically cut using laser 706 or a saw to complete unit device chips.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The semiconductor device and the method of manufacturing the same according to the embodiments can be applied to electronic or photoelectric devices.

The invention claimed is:

1. A semiconductor device having a plurality of bonding layers, comprising:
a support substrate;
a first bonding layer on a top surface of the support substrate;
a second bonding layer on a top surface of the first bonding layer; and
a single crystal semiconductor thin layer on a top surface of the second bonding layer,
wherein the first bonding layer has a same metal material from the second bonding layer.

2. The semiconductor device according to claim 1, wherein the first bonding layer is formed of gold (Au).

3. The semiconductor device according to claim 1, wherein the support substrate is a wafer formed of one of silicon (Si), gallium arsenic (GaAs), germanium (Ge), silicon germanium (SiGe), aluminum nitride (AlN), gallium nitride (GaN), aluminum gallium nitride (AlGaN), silicon carbide (SiC), and aluminum silicon carbide (AlSiC), or a plate formed of one of nickel (Ni), copper (Cu), niobium (Nb), molybdenum (Mo), tantalum (Ta), niobium copper (NbCu), molybdenum copper (MoCu), tantalum copper (TaCu), silicon aluminum (SiAl), copper tungsten (CuW), nickel tungsten (NiW), and nickel copper (NiCu).

4. The semiconductor device according to claim 1, wherein the single crystal semiconductor thin layer has a single or multi layer structure formed of one of a group III-V compound, a group II-VI compound, silicon (Si), silicon carbide (SiC), or silicon germanium (SiGe).

5. The semiconductor device according to claim 1, wherein the single crystal semiconductor thin layer is a light emitting diode comprising an n type clad layer, an active layer, and a p type clad layer.

6. The semiconductor device according to claim 1, further comprising a third bonding layer under a bottom surface of the support substrate.

7. The semiconductor device according to claim 6, further comprising a fourth bonding layer under a bottom surface of the third bonding layer.

8. The semiconductor device according to claim 6, wherein the third bonding layer has a same metal material from the fourth bonding layer.

9. The semiconductor device according to claim 7, wherein the first bonding layer has a same material from the third bonding layer.

10. The semiconductor device according to claim 9, wherein the third bonding layer is formed of gold (Au).

11. The semiconductor device according to claim 1, wherein the first bonding layer is physically contacted with a bottom surface of the second bonding layer and the top surface of the support substrate.

12. The semiconductor device according to claim 7, wherein the fourth bonding layer is physically contacted with a bottom surface of the third bonding layer and the bottom surface of the support substrate.

13. A semiconductor device having a plurality of bonding layers, comprising:
a support substrate;
a first bonding layer on a top surface of the support substrate;

a second bonding layer under a bottom surface of the support substrate; and a plurality of semiconductor layers on a top surface of the first bonding layer, wherein the first bonding layer has a same metal material from the second bonding layer, wherein the first and second bonding layers have a thickness thinner than that of the support substrate, and wherein the support substrate has a width wider than the first bonding layer.

14. The semiconductor device according to claim 13, wherein the first and the second bonding layers are formed of gold (Au).

15. The semiconductor device according to claim 13, wherein a thickness of first bonding layer ranges from about 1 μm to about 30 μm.

16. The semiconductor device according to claim 13, further comprising a passivation layer on an outer surface of the first bonding layer and the plurality of semiconductor layers.

17. The semiconductor device according to claim 13, further comprising a passivation layer on an outer surface of the first bonding layer and the plurality of semiconductor layers, wherein the passivation layer is physically contacted with the top surface of the support substrate.

18. The semiconductor device according to claim 13, wherein the first bonding layer includes a plurality of bonding layers which is formed of a same metal material from each other.

* * * * *